(12) United States Patent
Kobayashi et al.

(10) Patent No.: US 9,203,674 B2
(45) Date of Patent: Dec. 1, 2015

(54) RECEIVING DEVICE, RECEIVING METHOD, AND PROGRAM

(75) Inventors: Kenichi Kobayashi, Tokyo (JP); Tadaaki Yuba, Tokyo (JP); Hiroyuki Kamata, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 81 days.

(21) Appl. No.: 14/000,064

(22) PCT Filed: Mar. 1, 2012

(86) PCT No.: PCT/JP2012/055234
§ 371 (c)(1),
(2), (4) Date: Aug. 16, 2013

(87) PCT Pub. No.: WO2012/121104
PCT Pub. Date: Sep. 13, 2012

(65) Prior Publication Data
US 2013/0329839 A1 Dec. 12, 2013

(30) Foreign Application Priority Data

Mar. 10, 2011 (JP) .................................. 2011-053064

(51) Int. Cl.
*H04L 27/06* (2006.01)
*H04L 27/26* (2006.01)
(Continued)

(52) U.S. Cl.
CPC .......... *H04L 27/2647* (2013.01); *H03G 3/3078* (2013.01); *H04L 5/0023* (2013.01); *H04L5/0048* (2013.01); *H04L 25/0224* (2013.01); *H04L 27/2613* (2013.01); *H04B 7/0669* (2013.01)

(58) Field of Classification Search
CPC .................... H04L 27/2657; H04L 2027/003; H04L 2027/0065; H04L 27/2332; H04L 27/0014; H04L 1/06; H04L 27/2647; H04L 27/2035; H04L 27/2275; H04L 5/06; H04L 25/497; H04B 7/0845; H04B 7/0854; H04B 7/0857; H04B 1/707
USPC .................................................. 375/259–352
See application file for complete search history.

(56) References Cited

U.S. PATENT DOCUMENTS

2004/0114618 A1* 6/2004 Tong et al. ..................... 370/431
2009/0161782 A1* 6/2009 Kolze et al. ................... 375/260
(Continued)

FOREIGN PATENT DOCUMENTS

EP    2 259 516 A2    12/2010
JP    2001-177426 A    6/2001

OTHER PUBLICATIONS

International Search Report issued Jun. 5, 2012 in PCT/JP2012/055234.
(Continued)

*Primary Examiner* — James M Perez
(74) *Attorney, Agent, or Firm* — Oblon, McClelland, Maier & Neustadt, L.L.P.

(57) ABSTRACT

The present technique relates to a receiving device, a receiving method, and a program that are designed to improve reception performance. A receiving device according to one aspect of the present technique includes: a gain control unit that adjusts the power of a signal including a first pilot signal transmitted as signals having a high correlation in terms of polar direction via different transmission channels, and a second pilot signal transmitted as signals having a low correlation in terms of polar direction via the different transmission channels; and a control unit that controls the followability of the gain at the gain control unit in accordance with a data transmission method. The present technique can be applied to a receiver that receives data transmitted by MISO (Multi Input, Single Output) compliant with the DVB-T2 standards.

9 Claims, 13 Drawing Sheets

(51) Int. Cl.
*H04L 5/00* (2006.01)
*H03G 3/30* (2006.01)
*H04L 25/02* (2006.01)
*H04B 7/06* (2006.01)

(56) References Cited

U.S. PATENT DOCUMENTS

2009/0168909 A1* 7/2009 Stadelmeier et al. ......... 375/260
2010/0107042 A1* 4/2010 Sawai et al. .................. 714/799
2010/0310016 A1* 12/2010 Okehie et al. ................. 375/340
2010/0310017 A1* 12/2010 Atungsiri ...................... 375/340
2011/0019784 A1* 1/2011 Michael et al. ............... 375/346

OTHER PUBLICATIONS

"Frame structure channel coding and modulation for a second generation digital terrestrial television broadcasting system (DVB-T2)" Digital Video Broadcasting, Document A122, Jun. 2008.

* cited by examiner

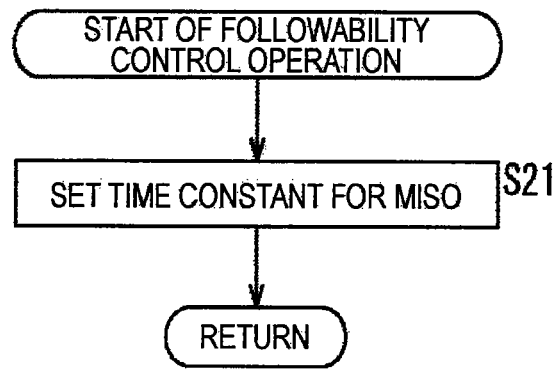
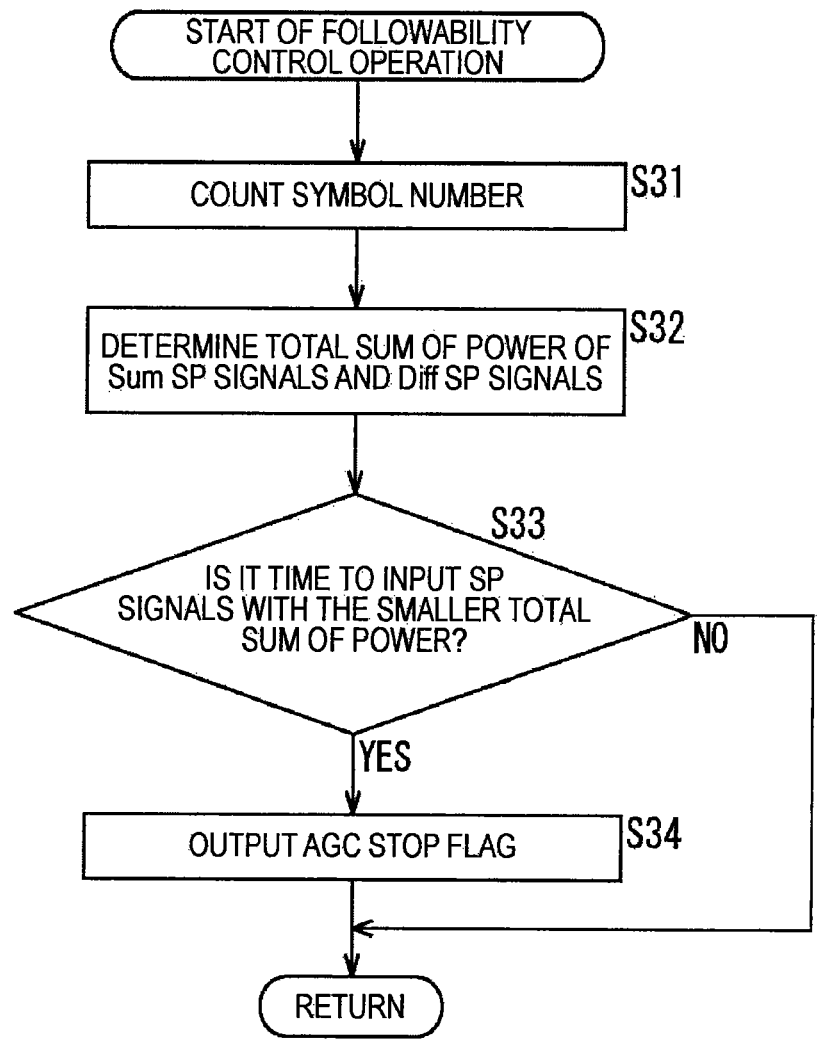

RECEIVING DEVICE, RECEIVING METHOD, AND PROGRAM

TECHNICAL FIELD

The present technique relates to receiving devices, receiving methods, and programs, and more particularly, to a receiving device, a receiving method, and a program that are designed to be capable of improving reception performance.

BACKGROUND ART

[OFDM]

In data transmission by OFDM (Orthogonal Frequency Division Multiplexing), a large number of orthogonal subcarriers are used in the transmission band, and data is allocated to the amplitude and the phase of each of the subcarriers. Data of each symbol called an OFDM symbol is transmitted. At the time of transmission, an IFFT (Inverse Fast Fourier Transform) is performed on each OFDM symbol.

FIG. 1 is a diagram showing OFDM symbols. An OFDM symbol is normally formed with an effective symbol that is a signal interval in which an IFFT is performed at the time of transmission, and a guard interval (GI) formed by copying the waveform of part of the latter half of the effective symbol and placing the copy at the top of the effective symbol.

As the guard interval is formed at the top of the OFDM symbol, resistance to multipathing can be increased. Such OFDM symbols constitute one OFDM transmission frame.

[MISO of DVB-T2]

According to the second-generation digital terrestrial broadcasting standards in Europe (DVB-T2), data transmission by MISO (Multi Input, Single Output) can be performed. For example, data is transmitted by using two antennas on the transmission side. Accordingly, diversity can be generated by a combination of signals transmitted from the two antennas, and reception performance can be improved. Data transmission by MISO is particularly effective in an intensive multipathing environment.

FIG. 2 is a diagram showing data transmission by MISO according to DVB-T2.

As shown in FIG. 2, a MISO transmitter has the two antennas of an antenna 1 (Tx1) and an antenna 2 (Tx2), and a MISO receiver has one antenna (Rx1). Two signals Sa and Sb, which form an Alamouti pair, are input to the MISO transmitter.

The MISO transmitter performs Alamouti coding on Sa and Sb, and transmits Sa and Sb in this order from Tx1. Meanwhile, the MISO transmitter transmits (Sa)*, which is a complex conjugate of Sa, and −(Sb)*, which has the inverted sign, from Tx2 in the order of −(Sb)* to (Sa)*.

The MISO receiver estimates channel characteristics $H_{11}$, $H_{12}$, $H_{21}$, and $H_{22}$, and performs Alamouti decoding on received signals Ra and Rb, to obtain the transmitted signals Sa and Sb (Sa' and Sb'). Where the time to transmit Sa from Tx1 and −(Sb)* from Tx2 is time t1, and the time to transmit Sb from Tx1 and (Sa)* from Tx2 is time t2, $H_{11}$ represents the channel characteristics between Tx1 and Rx1 at time t1, and serve as a weight on Sa. Likewise, $H_{12}$ represents the channel characteristics between Tx1 and Rx1 at time t2, and serve as a weight on Sb. $H_{21}$ represents the channel characteristics between Tx2 and Rx1 at time t1, and serve as a weight on −(Sb)*, and $H_{22}$ represents the channel characteristics between Tx2 and Rx1 at time t2, and serve as a weight on (Sa)*.

At the MISO receiver, the received signals Ra and Rb are expressed by the following equations (1) and (2).

$$R_a = H_{11} S_a - H_{21} S_b^* \qquad \text{[Mathematical Formula 1]}$$

$$R_b = H_{12} S_b - H_{22} S_a^* \qquad \text{[Mathematical Formula 2]}$$

The equations (1) and (2) are transformed into a determinant as shown in the following equation (3).

[Mathematical Formula 3]

$$\begin{bmatrix} R_a \\ R_b^* \end{bmatrix} = \begin{bmatrix} H_{11} & -H_{21} \\ H_{22}^* & H_{12}^* \end{bmatrix} \begin{bmatrix} S_a \\ S_b^* \end{bmatrix} \qquad (3)$$

Where a matrix R represents the received signals, a matrix H represents the channel characteristics, and a matrix S represents the transmitted signals, the equation (3) is expressed by the equation (4) shown below. The matrixes R, H, and S are expressed by the equations (5), (6), and (7), respectively.

$$R = HS \qquad \text{[Mathematical Formula 4]}$$

[Mathematical Formula 5]

$$R = \begin{bmatrix} R_a \\ R_b^* \end{bmatrix} \qquad (5)$$

[Mathematical Formula 6]

$$H = \begin{bmatrix} H_{11} & -H_{21} \\ H_{22}^* & H_{12}^* \end{bmatrix} \qquad (6)$$

[Mathematical Formula 7]

$$S = \begin{bmatrix} S_a \\ S_b^* \end{bmatrix} \qquad (7)$$

The Alamouti decoding by the MISO receiver is expressed by the equation (8) shown below. S' is the matrix representing the signals obtained after the Alamouti decoding.

[Mathematical Formula 8]

$$\begin{aligned} S' &= H^{-1} R \\ &= H^{-1} H S \\ &= S \end{aligned} \qquad (8)$$

In the equation (8), to obtain the matrix S representing the transmitted signals from the matrix R representing the received signals, the matrix R is multiplied by the inverse matrix of the matrix H representing the channel characteristics. If there is no noise, the matrix S is exactly the same as the matrix S'. The matrix S' is expressed by the following equation (9).

[Mathematical Formula 9]

$$S' = \begin{bmatrix} S_a' \\ S_b^{*\prime} \end{bmatrix} \qquad (9)$$

The MISO receiver outputs Sa' and Sb', which are determined in the above described manner.

FIG. 3 is a diagram showing an example of arrangement of SP (Scattered Pilot) signals in a case where data transmission is performed by MISO. In FIG. 3, the abscissa axis indicates carrier number, and the ordinate axis indicates symbol number.

SP signals are known signals that are used in estimating channel characteristics. In the digital terrestrial broadcasting standards in Europe (DVB-T) and the digital terrestrial broadcasting standards in Japan (ISDB-T), arrangement of SP signals is uniquely set. In DVB-T2, on the other hand, eight Pilot Patterns (PP) are defined. A MISO receiver of DVB-T2 determines a PP based on information contained in received signals, and estimates channel characteristics by using SP signals. The SP arrangement shown in FIG. 3 is the arrangement in the case of PP2.

When data transmission is performed by MISO, SP signals are transmitted as Sum SP signals or Diff SP signals, as shown in FIG. 3.

A Sum SP signal is a SP signal for a symbol having an even number allotted thereto (the symbol number being an even number). Sum SP signals are transmitted as SP signals having polarities not to be changed (hereinafter referred to as normal SP signals) from Tx1 and Tx2, and are combined at the MISO receiver.

A Diff SP signal is a SP signal for a symbol having an odd number allotted thereto (the symbol number being an odd number). Diff SP signals are transmitted as normal SP signals from Tx1 and as SP signals having polarities reversed (hereinafter referred to as inverted SP signals) from Tx2, and are subjected subtractions at the MISO receiver. In a state where a polarity is reversed, a symmetry with respect to the point of origin in the I-Q plane is observed.

The MISO receiver performs interpolation on the Sum SP signals and the Diff SP signals in the temporal direction and the frequency direction, and estimates the channel characteristics of all the carriers.

[Signaling of DVB-T2]

According to DVB-T2, frames called T2 frames are defined, and data is transmitted by the T2 frame.

Each T2 frame contains two kinds of preamble signals called P1 and P2, and those preamble signals contain information necessary for operations such as OFDM signal demodulation.

FIG. 4 is a diagram showing the frame structure of a T2 frame. As shown in FIG. 4, one T2 frame includes a P1 symbol, P2 symbols, and data symbols (Normal or FC).

The P1 symbol is the symbol for transmitting P1 Signaling, and contains the following information a through d.
a. Frame identification
b. Transmission method
c. FFT size
d. Partial GI length The frame identification indicates whether the transmission frame is a T2 frame or a FEF (Future Extension Frame). The transmission method indicates whether the transmission method is SISO (Single Input, Single Output) or MISO (Multiple Input, Single Output). The FFT size indicates the number of points in one IFFT operation on the transmission side. The partial GI length indicates to which group the GI length being used in the symbol transmission belongs, with seven types of GI lengths being divided into two groups.

To determine whether the transmission method used for transmitted signals is SISO or MISO, the MISO receiver should decode P1 Signaling. Although the above described information a through d is subjected to Signaling in an overlapping manner in the P2 symbols, the above described information a through d of P1 Signaling is necessary for decoding L1PRE Signaling and L1POST Signaling of the P2 symbols.

CITATION LIST

Non-Patent Document

Non-Patent Document 1: "Frame structure channel coding and modulation for a second generation digital terrestrial television broadcasting system (DVB-T2)", DVB Document A122 June 2008

SUMMARY OF THE INVENTION

Problems to be Solved by the Invention

In MISO, there is a large difference between the power of a Sum SP signal and the power of a Diff SP signal, depending on the states of the transmission channel between Tx1 and Rx1 and the transmission channel between Tx2 and Rx1. Examples of such situations are described below.

Example 1

A case where the amplitude characteristics and the phase characteristics are the same between the Tx1-Rx1 transmission channel and the Tx2-Rx1 transmission channel (where $H_{11}=H_{21}$, and $H_{12}=H_{22}$)

In this case, as for a symbol with an odd number, the normal SP signal from Tx1 and the inverted SP signal from Tx2 cancel each other, and the power of the Diff SP signal at the MISO receiver is "0", as shown in FIG. 5. That is, the SP power becomes "0" every other symbol.

The first row in FIG. 5 indicates signals transmitted from Tx1 of the MISO transmitter, and the second row indicates signals transmitted from Tx2. The third row in FIG. 5 indicates signals received at Rx1 of the MISO receiver, and the fourth row indicates an example of gain control at the MISO receiver.

In the example illustrated in FIG. 5, the power of Diff SP signals transmitted as normal SP signals from Tx1 and the power of Diff SP signals transmitted as inverted SP signals from Tx2 cancel each other at the MISO receiver, as indicated by the arrows shown at symbols #1 and #3, which are symbols with odd numbers. The power of each Diff SP signal at the MISO receiver is "0".

Meanwhile, the power of Sum SP signals transmitted as normal SP signals from Tx1 and the power of Sum SP signals transmitted as inverted SP signals from Tx2 are combined with each other at the MISO receiver, as indicated by the arrows shown at symbols #0 and #2, which are symbols with even numbers. Where the power of each Sum SP signal is "1", the power of each Sum SP signal at the MISO receiver is "2".

Example 2

A case where the amplitude characteristics are the same between the Tx1-Rx1 transmission channel and the Tx2-Rx1 transmission channel, but the phase characteristics are the opposite (where $H_{11}=-H_{21}$, and $H_{12}=-H_{22}$)

This case is the opposite of Example 1. As for a symbol with an even number, the normal SP signal from Tx1 and the inverted SP signal from Tx2 cancel each other, and the power of the Sum SP signal is "0". That is, the SP power becomes "0" every other symbol.

In cases other than Example 1 and Example 2, large differences might be caused between the power of Sum SP signals and Diff SP signals in MISO, resulting in power imbalance that appears every other symbol in the entire OFDM signals. Particularly, in the case of a PP with shorter SP signal intervals, the power imbalance become conspicuous.

Normally, an AGC (Automatic Gain Control) function is provided in the MISO receiver, and the power of input OFDM signals is maintained at a constant value. In a case where the power of an input OFDM signal is low, a high gain is set to increase the power. In a case where the power of an input OFDM signal is high, on the other hand, a low gain is set to lower the power. Such control is dynamically performed.

Therefore, in a case where an input OFDM signal is a signal of a symbol with an even number, a low gain follows detection of high power at the MISO receiver, as shown in the fourth row in FIG. 5. Also, in a case where an input OFDM signal is a signal of a symbol with an odd number, a high gain follows detection of low power at the MISO receiver. The gain variations at the portions indicated by ellipses C1 and C2 in FIG. 5 mean that the OFDM signals are signals of symbols with odd numbers, and the gain follows detection of low power.

As described above, depending on the following speed of the gain, the gain follows power imbalance that appears in the entire OFDM signals every other symbol, and the power of the input OFDM signals greatly varies. As a result, reception performance might be degraded.

The present technique has been developed in view of those circumstances, and an object thereof is to improve reception performance even when data transmission is performed by MISO, for example.

Solutions to Problems

A receiving device according to one aspect of the present technique includes: a gain control unit that adjusts the power of a signal including a first pilot signal transmitted as signals having a high correlation in terms of polar direction via different transmission channels, and a second pilot signal transmitted as signals having a low correlation in terms of polar direction via the different transmission channels; and a control unit that controls the followability of the gain at the gain control unit in accordance with a data transmission method.

The signals having the high correlation in terms of polar direction include signals that not only have exactly the same polar directions but also have a correlation value equal to or larger than a threshold, the correlation value indicating the correlation in terms of polar direction. The signals having the low correlation in terms of polar direction include signals that not only have exactly the opposite polar directions but also have a correlation value smaller than a threshold, the correlation value indicating the correlation in terms of polar direction. The followability may be indicated by a following speed.

When the data transmission method is MISO, the control unit may cause the gain to follow with characteristics different from those with SISO.

The control unit may control the followability of the gain at the gain control unit by changing a parameter defining the followability of the gain.

The parameter defining the followability of the gain may be a time constant. The followability of the gain may be controlled by changing a parameter other than the time constant.

The control unit may control the followability of the gain by stopping the gain control while one of the first pilot signal and the second pilot signal is input.

The gain control unit may adjust the power of an OFDM signal of DVB-T2, with the first pilot signal being a Sum SP signal, the second pilot signal being a Diff SP signal.

The receiving device may further include a detecting unit that detects a P1 symbol. In this case, when the data transmission method indicated by information contained in the P1 symbol is MISO, the control unit may control the followability of the gain at the gain control unit.

The control unit may control the followability of the gain at the gain control unit by setting such a parameter as to make the followability of the gain lower than the followability achieved when the data transmission method is SISO.

The receiving device may further include a processing unit that extracts the first pilot signal and the second pilot signal from the OFDM signal, and determines the pilot signal with the lower power. In this case, the control unit may control the followability of the gain at the gain control unit by stopping the gain control while the pilot signal with the lower power is input.

The receiving device may further include a processing unit that calculates a difference between the power of the first pilot signal and the power of the second pilot signal. In this case, when the data transmission method indicated by the information contained in the P1 symbol is MISO, and the difference between the power of the first pilot signal and the power of the second pilot signal is equal to or larger than a threshold, the control unit may control the followability of the gain at the gain control unit.

The control unit may control the followability of the gain at the gain control unit by setting such a parameter as to make the followability of the gain lower than the followability achieved when the data transmission method is SISO.

The processing unit may further determine which one of the first pilot signal and the second pilot signal has the lower power, and the control unit may control the followability of the gain at the gain control unit by stopping the gain control while the pilot signal with the lower power is input.

In the one aspect of the present technique, a gain control unit adjusts the power of a signal including a first pilot signal transmitted as signals having a high correlation in terms of polar direction via different transmission channels, and a second pilot signal transmitted as signals having a low correlation in terms of polar direction via the different transmission channels. A control unit controls the followability of the gain at the gain control unit in accordance with a data transmission method.

Effects of the Invention

According to the present technique, reception performance can be improved.

BRIEF DESCRIPTION OF DRAWINGS

FIG. 8 is a flowchart for explaining a first followability control operation to be performed in step S6 of FIG. 7.

FIG. 9 is a flowchart for explaining a second followability control operation to be performed in step S6 of FIG. 7.

MODES FOR CARRYING OUT THE INVENTION

[Structure of a Signal Processing Unit]

Figure 6:
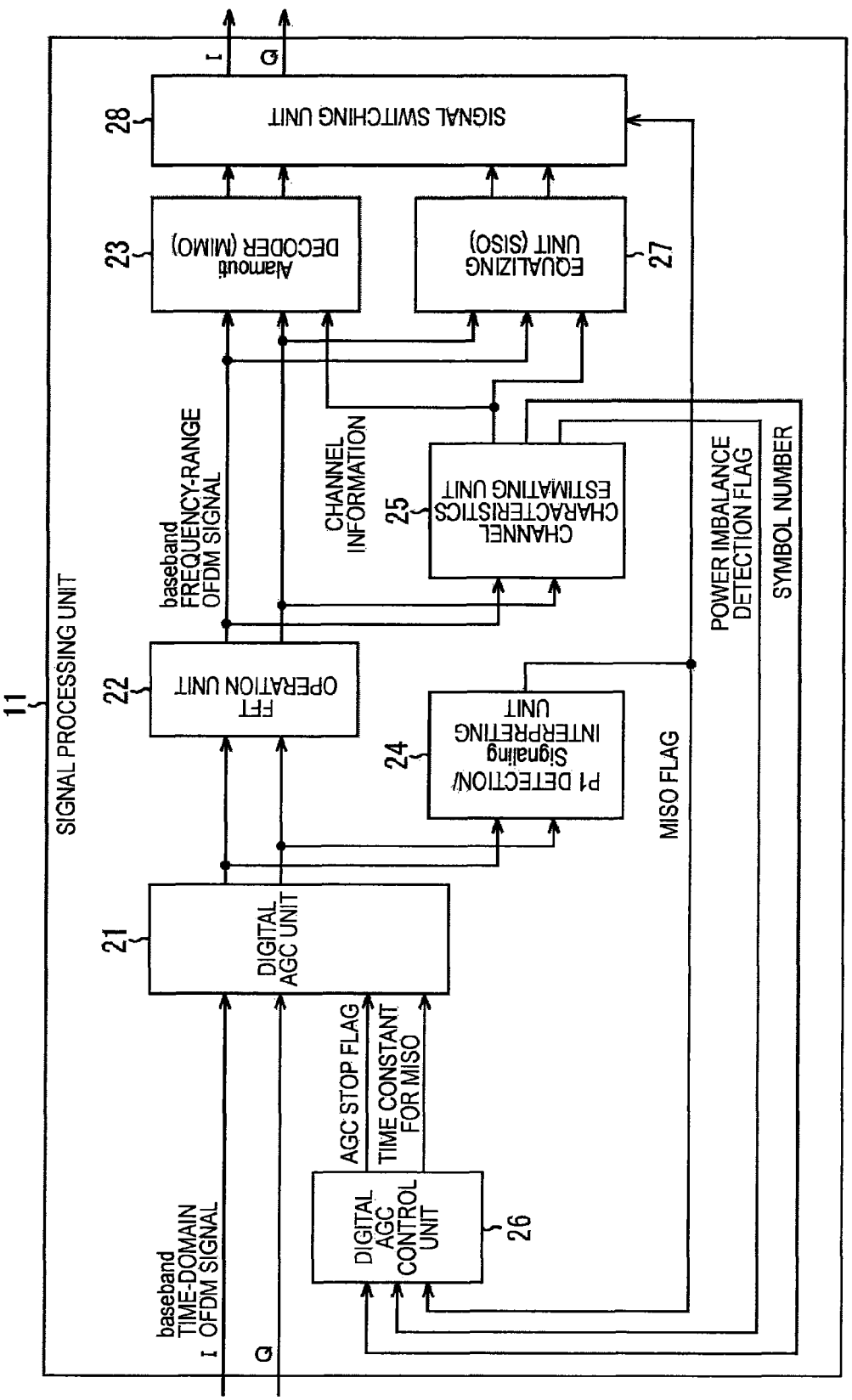
FIG. 6 is a block diagram showing an example structure of a signal processing unit provided in a receiving device according to an embodiment of the present technique.

FIG. 6 is a block diagram showing an example structure of a signal processing unit 11 provided in a receiving device according to an embodiment of the present technique.

Figure 1:
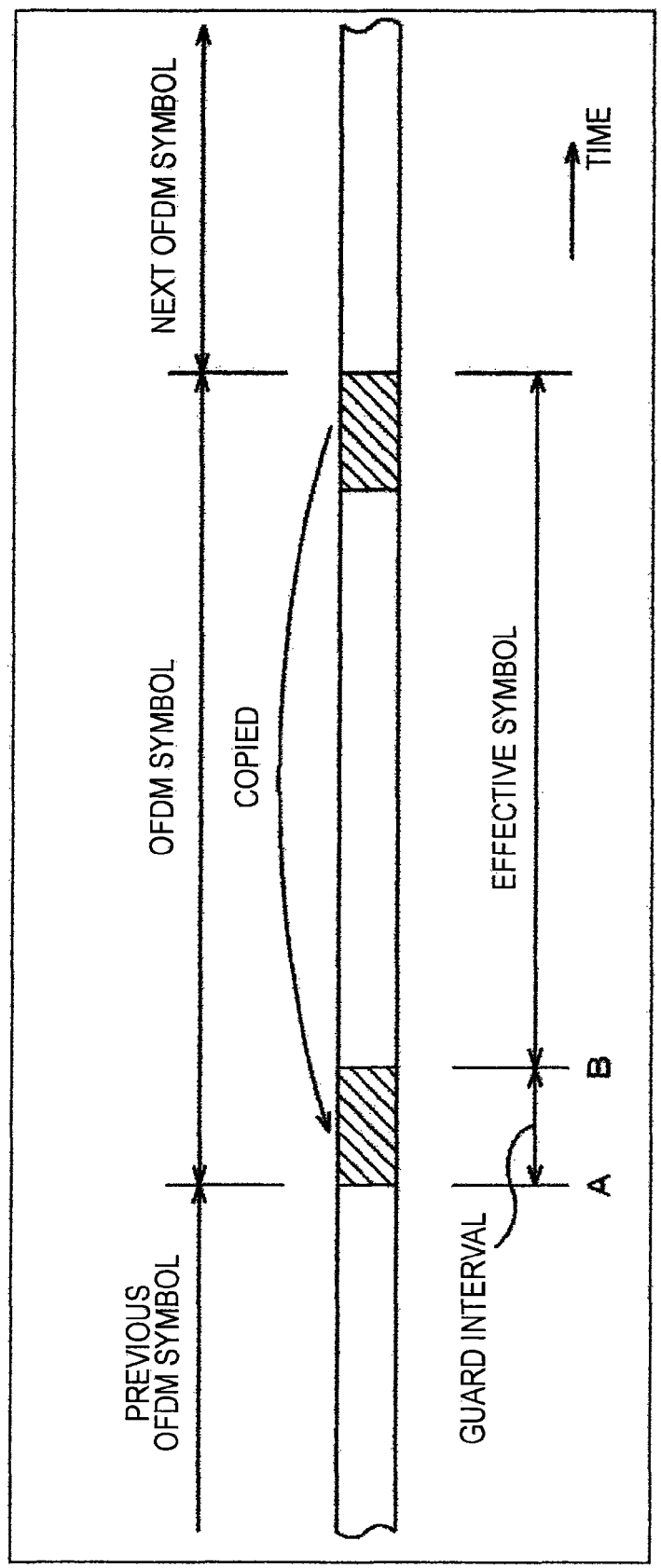
FIG. 1 is a diagram showing OFDM symbols.
Figure 2:
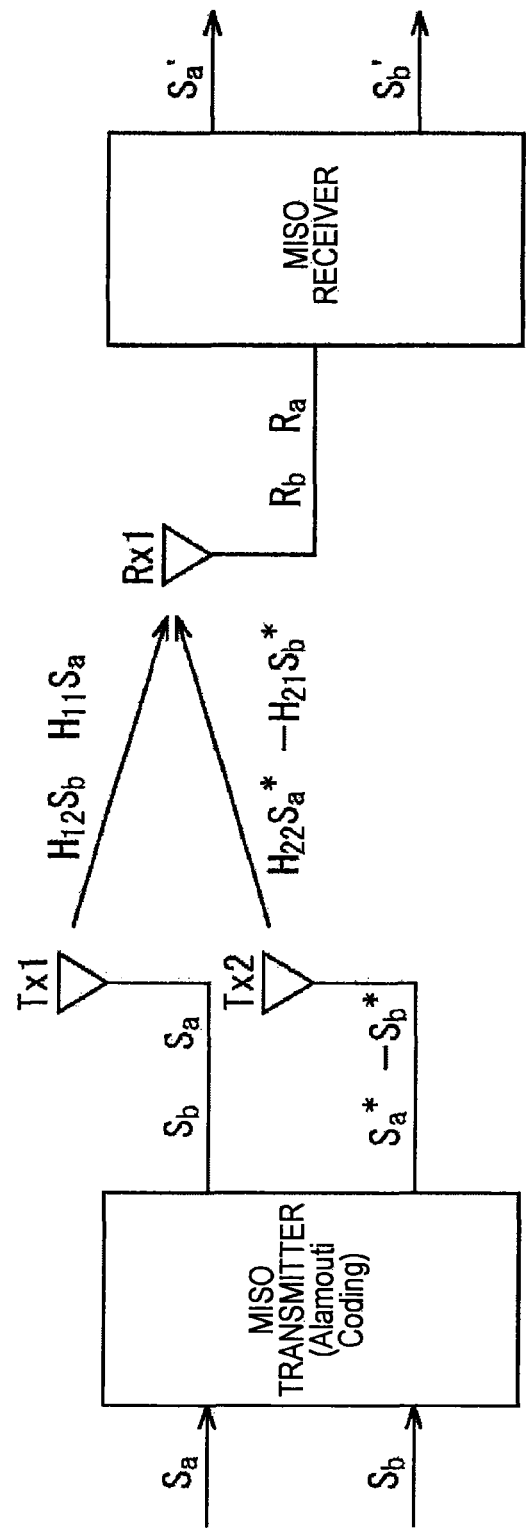
FIG. 2 is a diagram showing data transmission by MISO.
Figure 3:
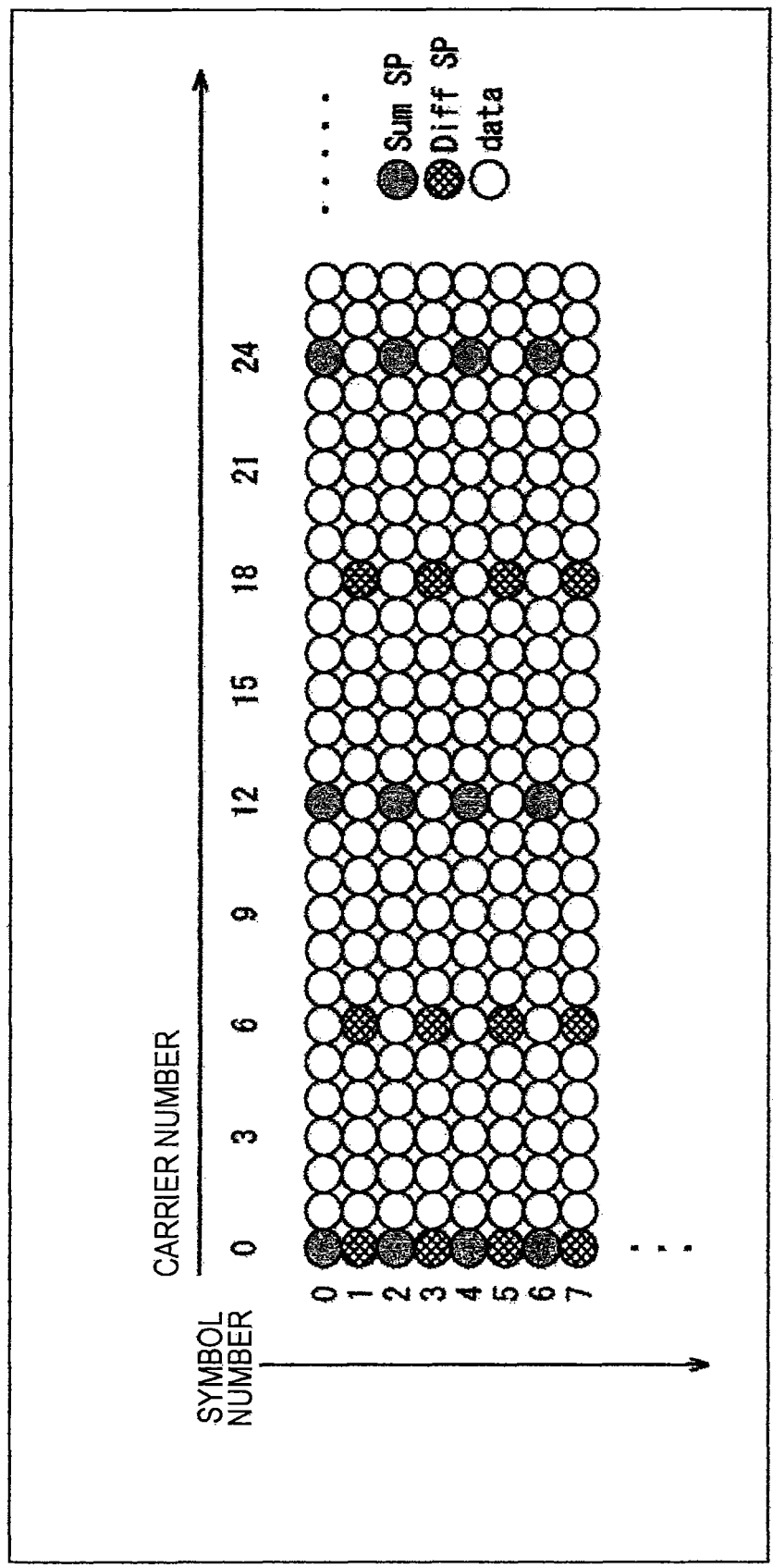
FIG. 3 is a diagram showing an example of SP arrangement.
Figure 4:
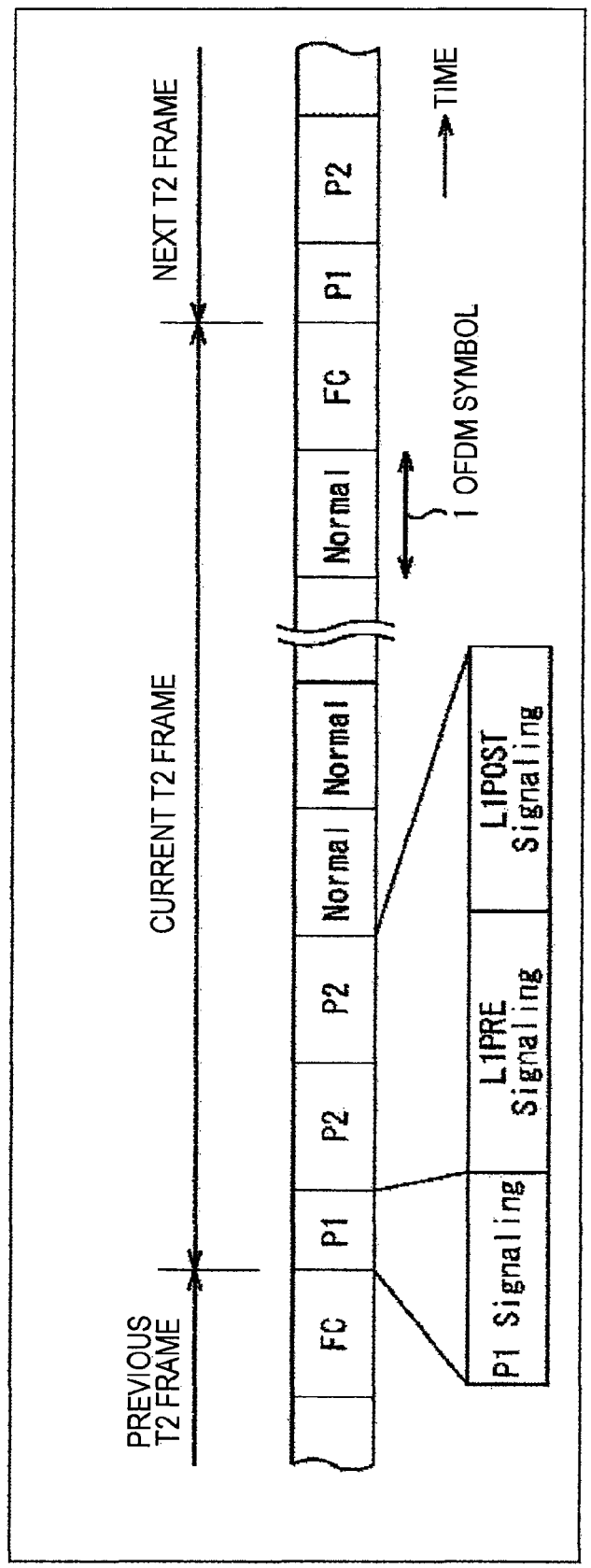
FIG. 4 is a diagram showing the frame structures of T2 frames.

The receiving device including the signal processing unit 11 shown in FIG. 6 has a function of a MISO receiver to receive signals transmitted from a MISO transmitter like the MISO transmitter shown in FIG. 2, and a function to receive signals transmitted by SISO. The receiving device has an antenna (Rx1).

The signal processing unit 11 includes a digital AGC unit 21, a FFT operation unit 22, an Alamouti decoder 23, a P1 detection/Signaling interpreting unit 24, a channel characteristics estimating unit 25, a digital AGC control unit 26, an equalizing unit 27, and a signal switching unit 28.

OFDM signals that are compliant with DVB-T2 and are obtained by performing A-D conversions and orthogonal demodulation on received signals received by Rx1 are input to the signal processing unit 11. The OFDM signals that are input to the signal processing unit 11 are baseband signals of a time domain before a FFT operation, and contain real-axis components (I components) and imaginary-axis components (Q components).

The OFDM signals that are input to the signal processing unit 11 are signals transmitted from a transmitter by SISO or MISO. When transmitting signals by MISO, the transmitter transmits Sum SP signals as normal SP signals from both Tx1 and Tx2, and Diff SP signals as a normal SP signal from Tx1 and as an inverted SP signal from Tx2. The Sum SP signals are transmitted as signals having a high correlation in terms of polar direction via different transmission channels, and Diff SP signals are transmitted as signals having a low correlation in terms of polar direction via the different transmission channels.

The digital AGC unit 21 controls the gain, and adjusts the power of the input OFDM signals. At the start of an operation, the gain control by the digital AGC unit 21 is performed in accordance with a predetermined time constant. The time constant is one of the parameters that define the followability in the gain control.

The gain control by the digital AGC unit 21 is controlled by the digital AGC control unit 26, where appropriate, depending on the data transmission method or the like. The digital AGC unit 21 outputs time-domain OFDM signals having the power adjusted, to the FFT operation unit 22 and the P1 detection/Signaling interpreting unit 24.

The FFT operation unit 22 performs a FFT operation on the time-domain OFDM signals supplied from the digital AGC unit 21. The FFT operation unit 22 outputs the frequency-range OFDM signals obtained through the FFT operation, to the Alamouti decoder 23, the channel characteristics estimating unit 25, and the equalizing unit 27.

The Alamouti decoder 23 performs Alamouti decoding by using the channel characteristics of the Tx1-Rx1 transmission channel and the Tx2-Rx1 transmission channel estimated by the channel characteristics estimating unit 25 for each carrier, and performs equalization on the frequency-range OFDM signals.

The Alamouti decoder 23 outputs the equalized OFDM signals (Sa' and Sb') to the signal switching unit 28.

The P1 detection/Signaling interpreting unit 24 detects the P1 symbol contained at the top of the T2 frame, and decodes P1 Signaling transmitted through the P1 symbol. Based on the P1 Signaling obtained through the decoding, the P1 detection/Signaling interpreting unit 24 determines whether the data transmission method is SISO or MISO. As described above, P1 Signaling contains information indicating whether the transmission method is SISO or MISO.

When the data transmission method is determined to be MISO, the P1 detection/Signaling interpreting unit 24 outputs a MISO flag to that effect, to the digital AGC control unit 26 and the signal switching unit 28. The information about the FFT size and the information about the partial GI length contained in the P1 Signaling decoded by the P1 detection/Signaling interpreting unit 24 are used at other processing units such as the FFT operation unit 22, where appropriate.

The channel characteristics estimating unit 25 extracts SP signals (Sum SP signals and Diff SP signals) from the frequency-range OFDM signals supplied from the FFT operation unit 22, and estimates the channel characteristics of the carriers at the locations of the SP signals. The channel characteristics estimating unit 25 interpolates the channel characteristics of at the locations of the SP signals in the temporal direction and the frequency direction, estimates the channel characteristics of the respective carriers of the OFDM signals, and outputs channel information indicating the estimated channel characteristics to the Alamouti decoder 23 and the equalizing unit 27. The channel characteristics of the respective carriers in the Tx1-Rx1 transmission channel and the Tx2-Rx1 transmission channel are supplied to the Alamouti decoder 23.

Figure 5:
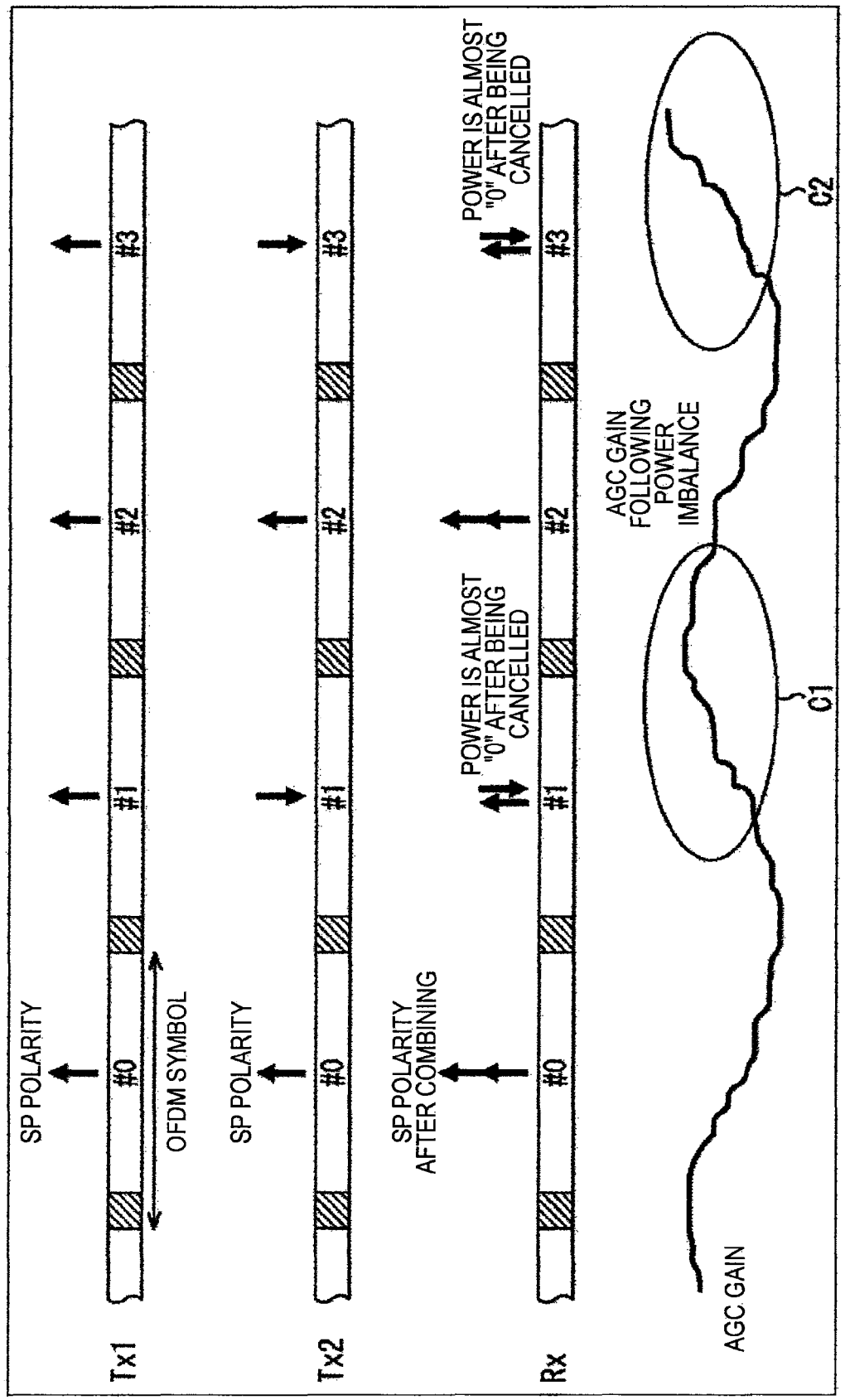
FIG. 5 is a diagram for explaining power differences between Sum SP signals and Diff SP signals.

In a case where the data transmission method is MISO, the channel characteristics estimating unit 25 calculates the difference between the power of the Sum SP signals and the power of the Diff SP signals, and determines whether there is power imbalance like that described with reference to FIG. 5. For example, in a case where the power difference between the Sum SP signals and the Diff SP signals is equal to or larger than a threshold, the channel characteristics estimating unit 25 determines that there is power imbalance, and outputs a power imbalance detection flag to that effect, to the digital AGC control unit 26.

The channel characteristics estimating unit 25 counts the symbol numbers of the SP signals, and outputs symbol number information to the digital AGC control unit 26. The channel characteristics estimating unit 25 also calculates the total sum of the power of the Sum SP signals and the total sum of the power of the Diff SP signals, and determines which SP signals between the Sum SP signals and the Diff SP signals have the smaller total sum of power. The channel characteristics estimating unit 25 outputs information indicating which SP signals between the Sum SP signals and the Diff SP signals have the smaller total sum of power, to the digital AGC control unit 26. The total sums of power are calculated by using a predetermined number of Sum SP signals and the predetermined number of Diff SP signals, for example.

In a case where the MISO flag is supplied from the P1 detection/Signaling interpreting unit 24, the digital AGC control unit 26 controls the followability of the gain at the digital AGC unit 21. In a case where the MISO flag is supplied from the P1 detection/Signaling interpreting unit 24, and the power imbalance detection flag is supplied from the channel characteristics estimating unit 25, the digital AGC control unit 26 also controls the followability of the gain at the digital AGC unit 21.

For example, the digital AGC control unit 26 controls the followability of the gain at the digital AGC unit 21 by setting such a time constant for MISO as to make the followability of the gain lower than that with the predetermined time constant in the digital AGC unit 21. In a case where the time constant for MISO is supplied from the digital AGC control unit 26, the digital AGC unit 21 controls the gain in accordance with the time constant for MISO, instead of the predetermined time constant.

Accordingly, even when power imbalance appears due to MISO data transmission, the gain can be controlled not to follow the power imbalance, and variations of the power of signals output from the digital AGC unit 21 can be reduced.

The digital AGC control unit 26 also outputs an AGC stop flag when the SP signals having the smaller total sum of power between the Sum SP signals and the Diff SP signals are input to the digital AGC unit 21, and thus stops the gain control. In this manner, the followability of the gain at the digital AGC unit 21 is controlled. The time at which the SP signals having the smaller total sum of power are input to the digital AGC unit 21 is determined based on the symbol numbers supplied from the channel characteristics estimating unit 25.

In a case where the AGC stop flag is supplied from the digital AGC control unit 26, the digital AGC unit 21 stops the gain control during the period in which the SP signals having the smaller total sum of power are input. While the gain control is stopped, the power adjustment may be stopped, or the power adjustment may be continued by using the gain obtained immediately before the gain control is stopped.

Accordingly, even when power imbalance appears due to MISO data transmission, the gain can be prevented from following the power imbalance during the period in which the SP signals having the smaller total sum of power are input, and variations of the power of the time-domain OFDM signals can be reduced. Alternatively, the gain control can be stopped during the period in which the SP signals having the larger total sum of power are input.

As variations of the power of OFDM signals are reduced by controlling the followability of the gain in the above described manner, reception performance degradation due to MISO data transmission can be prevented, and reception performance can be improved.

The equalizing unit 27 performs equalization on the frequency-range OFDM signals by using the channel characteristics estimated by the channel characteristics estimating unit 25 for each carrier, and outputs the equalized OFDM signals to the signal switching unit 28.

In a case where the MISO flag is supplied from the P1 detection/Signaling interpreting unit 24, or where the data transmission method is MISO, the signal switching unit 28 outputs the signals supplied from the Alamouti decoder 23 to an error correcting unit (not shown). In a case where the MISO flag is not supplied from the P1 detection/Signaling interpreting unit 24, or where the data transmission method is SISO, the signal switching unit 28 outputs the signals supplied from the equalizing unit 27 to the error correcting unit (not shown).

[Operations of the Receiving Device]

Operations of the receiving device are now described. The operation in each step is performed in parallel with the operation of another step, or is performed before or after the operation of another step, where appropriate.

Figure 7:
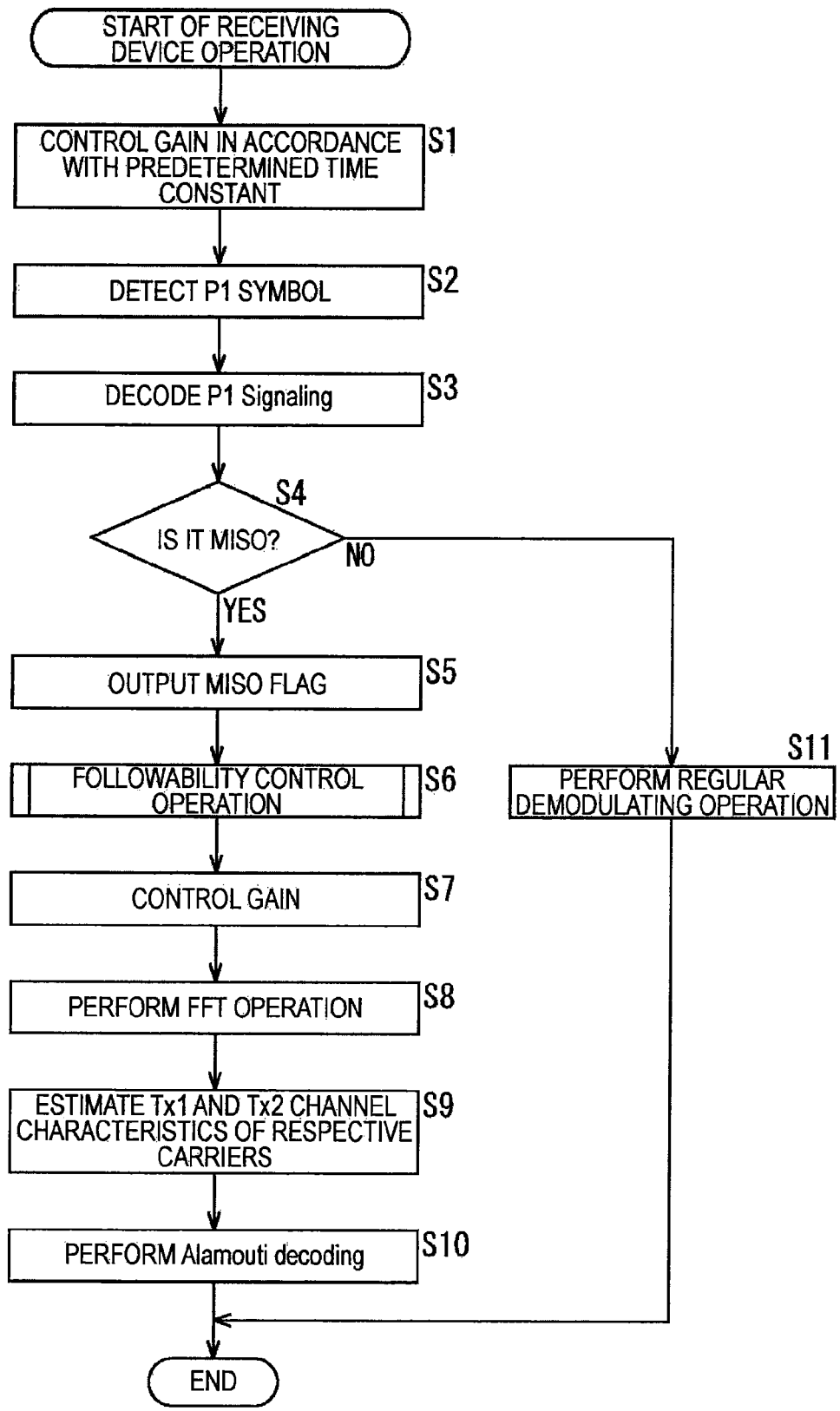
FIG. 7 is a flowchart for explaining operations of the receiving device.

Referring first to the flowchart shown in FIG. 7, the operation to be performed to control the followability of the gain when the MISO flag is supplied from the P1 detection/Signaling interpreting unit 24 is described.

In step S1, the digital AGC unit 21 controls the gain in accordance with the predetermined time constant, and adjusts the power of input OFDM signals.

In step S2, the P1 detection/Signaling interpreting unit 24 detects the P1 symbol.

In step S3, the P1 detection/Signaling interpreting unit 24 decodes P1 Signaling transmitted through the P1 symbol.

In step S4, the P1 detection/Signaling interpreting unit 24 determines whether the data transmission method is MISO based on information contained in the P1 Signaling.

If the data transmission method is determined to be MISO in step S4, the P1 detection/Signaling interpreting unit 24 outputs the MISO flag to the digital AGC control unit 26 in step S5.

In step S6, the digital AGC control unit 26 performs a followability control operation. The followability control operation will be described later, with reference to the flowcharts shown in FIGS. 7 and 8

In step S7, the digital AGC unit 21 controls the gain under the control of the digital AGC control unit 26, and outputs the time-domain OFDM signals having the power adjusted, to the FFT operation unit 22.

In step S8, the FFT operation unit 22 performs a FFT operation on the time-domain OFDM signals supplied from the digital AGC unit 21.

In step S9, based on the SP signals contained in the frequency-range OFDM signals supplied from the FFT operation unit 22, the channel characteristics estimating unit 25 estimates the channel characteristics of the respective carriers of the OFDM signals in the Tx1-Rx1 transmission channel and the Tx2-Rx1 transmission channel In step S10, the Alamouti decoder 23 performs Alamouti decoding by using the channel characteristics estimated by the channel characteristics estimating unit 25, and performs equalization on the frequency-range OFDM signals. The Alamouti decoder 23 outputs the equalized OFDM signals. The equalized OFDM signals output from the Alamouti decoder 23 are selected by the signal switching unit 28, and are output to the error correcting unit. The operation then comes to an end.

If the data transmission method is determined not to be MISO but to be SISO in step S4, on the other hand, the respective components of the signal processing unit 11 perform a regular demodulating operation in step S11. Specifically, the digital AGC unit 21 controls the gain in accordance with the predetermined time constant, and the FFT operation unit 22 performs a FFT operation on the time-domain OFDM signals having the power adjusted. The channel characteristics estimating unit 25 estimates channel characteristics based on the SP signals contained in the frequency-range OFDM signals, and the equalizing unit 27 performs equalization on the frequency-range OFDM signals by using the estimated channel characteristics. The equalized OFDM signals output from the equalizing unit 27 are selected by the signal switching unit 28, and are output to the error correcting unit.

Referring now to the flowchart shown in FIG. 8, a first followability control operation to be performed in step S6 of FIG. 7 is described. The operation shown in FIG. 8 is an operation to control the followability of the gain by setting a time constant for MISO.

In step S21, the digital AGC control unit 26 sets such a time constant for MISO in the digital AGC unit 21 as to make the followability of the gain lower than that with the predetermined time constant. After that, the procedures in step S6 and later in FIG. 7 are carried out, and the digital AGC unit 21 controls the gain in accordance with the time constant for MISO in step S7.

Referring now to the flowchart shown in FIG. 9, a second followability control operation to be performed in step S6 of FIG. 7 is described. The operation shown in FIG. 9 is an operation to control the followability of the gain by stopping the gain control.

In step S31, the channel characteristics estimating unit 25 counts the symbol numbers of the SP signals, and outputs symbol number information to the digital AGC control unit 26.

In step S32, the channel characteristics estimating unit 25 calculates the total sum of the power of the Sum SP signals and the total sum of the power of the Diff SP signals, and determines which SP signals between the Sum SP signals and the Diff SP signals have the smaller total sum of power. The channel characteristics estimating unit 25 outputs information indicating the SP signals with the smaller total sum of power, to the digital AGC control unit 26.

In step S33, the digital AGC control unit 26 determines whether the current time is the time to input the SP signals with the smaller total sum of power to the digital AGC unit 21.

If the current time is determined to be the time to input the SP signals with the smaller total sum of power to the digital AGC unit 21 in step S33, the digital AGC control unit 26 outputs the AGC stop flag to the digital AGC unit 21 in step S34, and ends the operation. After that, the procedures of step S6 and later in FIG. 7 are carried out, and, in response to the supply of the AGC stop flag, the digital AGC unit 21 stops the gain control in step S7 while the SP signals with the smaller total sum of power are input.

If the current time is determined not to be the time to input the SP signals with the smaller total sum of power to the digital AGC unit 21 in step S33, step S34 is skipped, and the digital AGC control unit 26 ends the operation. After that, the procedures of step S6 and later in FIG. 7 are carried out, and the digital AGC unit 21 controls the gain in accordance with the predetermined time constant in step S7.

Figure 10:
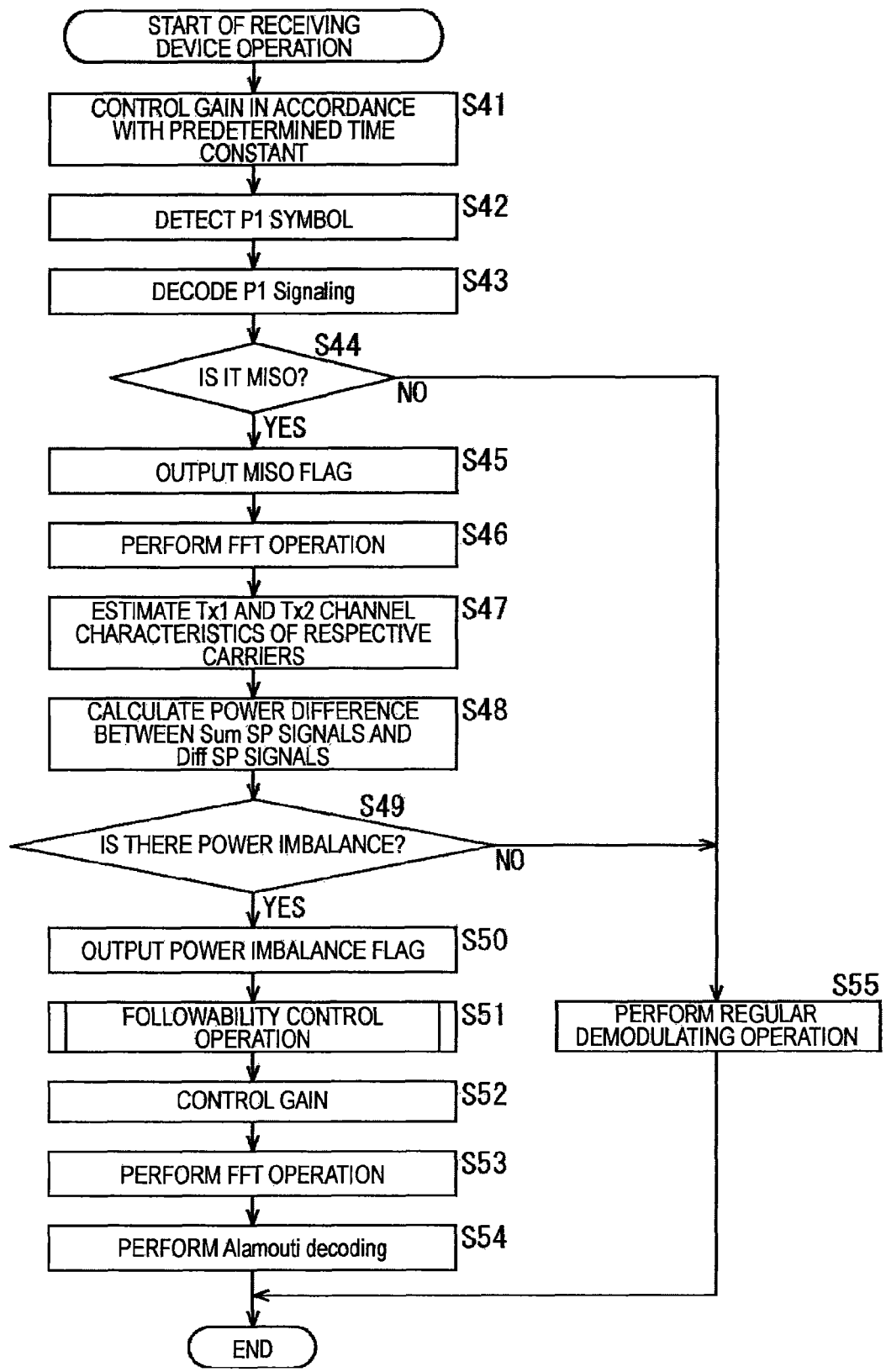
FIG. 10 is a flowchart for explaining other operations of the receiving device.

Referring now to the flowchart shown in FIG. 10, the operation to be performed to control the followability of the gain when the MISO flag is supplied from the P1 detection/Signaling interpreting unit 24 and the power imbalance detection flag is supplied from the channel characteristics estimating unit 25 is described.

The procedures of steps S41 through S45 of FIG. 10 are the same as the procedures of steps S1 through S5 of FIG. 7. Specifically, in step S41, the digital AGC unit 21 controls the gain in accordance with the predetermined time constant, and adjusts the power of input OFDM signals.

In step S42, the P1 detection/Signaling interpreting unit 24 detects the P1 symbol.

In step S43, the P1 detection/Signaling interpreting unit 24 decodes P1 Signaling transmitted through the P1 symbol.

In step S44, the P1 detection/Signaling interpreting unit 24 determines whether the data transmission method is MISO based on information contained in the P1 Signaling.

If the data transmission method is determined to be MISO in step S44, the P1 detection/Signaling interpreting unit 24 outputs the MISO flag to the digital AGC control unit 26 in step S45.

In step S46, the FFT operation unit 22 performs a FFT operation on the time-domain OFDM signals supplied from the digital AGC unit 21.

In step S47, based on the SP signals contained in the frequency-range OFDM signals supplied from the FFT operation unit 22, the channel characteristics estimating unit 25 estimates the channel characteristics of the respective carriers of the OFDM signals in the Tx1-Rx1 transmission channel and the Tx2-Rx1 transmission channel In step S48, the channel characteristics estimating unit 25 calculates the difference between the power of the Sum SP signals and the power of the Diff SP signals.

In step S49, based on the difference between the power of the Sum SP signals and the power of the Diff SP signals, the channel characteristics estimating unit 25 determines whether there is power imbalance like that described with reference to FIG. 5.

If power imbalance is detected in step S49, the channel characteristics estimating unit 25 outputs the power imbalance detection flag to the digital AGC control unit 26 in step S50.

In step S51, the digital AGC control unit 26 performs a followability control operation. As the followability control operation, the operation described with reference to the flowchart shown in FIG. 8 or the operation described with reference to the flowchart shown in FIG. 9 is performed.

In step S52, the digital AGC unit 21 controls the gain under the control of the digital AGC control unit 26, and outputs the time-domain OFDM signals having the power adjusted, to the FFT operation unit 22.

In step S53, the FFT operation unit 22 performs a FFT operation on the time-domain OFDM signals having the power adjusted in accordance with the gain having the followability controlled through the operation shown in FIG. 8 or 9.

In step S54, the Alamouti decoder 23 performs Alamouti decoding by using the channel characteristics estimated by the channel characteristics estimating unit 25, and performs equalization on the frequency-range OFDM signals. The Alamouti decoder 23 outputs the equalized OFDM signals. The equalized OFDM signals output from the Alamouti decoder 23 are selected by the signal switching unit 28, and are output to the error correcting unit. The operation then comes to an end.

If the data transmission method is determined not to be MISO but to be SISO in step S44, or if no power imbalance is detected in step S49, on the other hand, the respective components of the signal processing unit 11 perform a regular demodulating operation in step S55. That is, if the data transmission method is determined not to be MISO but to be SISO in step S44, the same operation as the operation of step S11 of FIG. 7 is performed. Also, if no power imbalance is detected in step S49, the followability of the gain is not controlled, and the data transmitted by MISO is demodulated.

Through the above described operations, even when power imbalance appears due to MISO data transmission, the gain can be controlled not to follow the power imbalance, and variations of the power of OFDM signals can be reduced. Also, reception performance degradation at the signal processing unit 11 can be prevented.

[Modifications]

In the above description, the followability of the gain is controlled by a control method using the time constant for MISO or a control method by which the gain control is stopped when the SP signals with the smaller total sum of power are input. However, the two control methods may be switched where appropriate.

For example, when the difference between the total sum of the power of Sum SP signals and the total sum of the power of Diff SP signals is smaller than a threshold, the former control method is used. When the difference between the total sum of the power of Sum SP signals and the total sum of the power of Diff SP signals is equal to or larger than the threshold, the latter control method is used. Also, the method for controlling the followability of the gain may be changed depending on PP.

[Examples of Applications in Receiving Systems]

Figure 11:
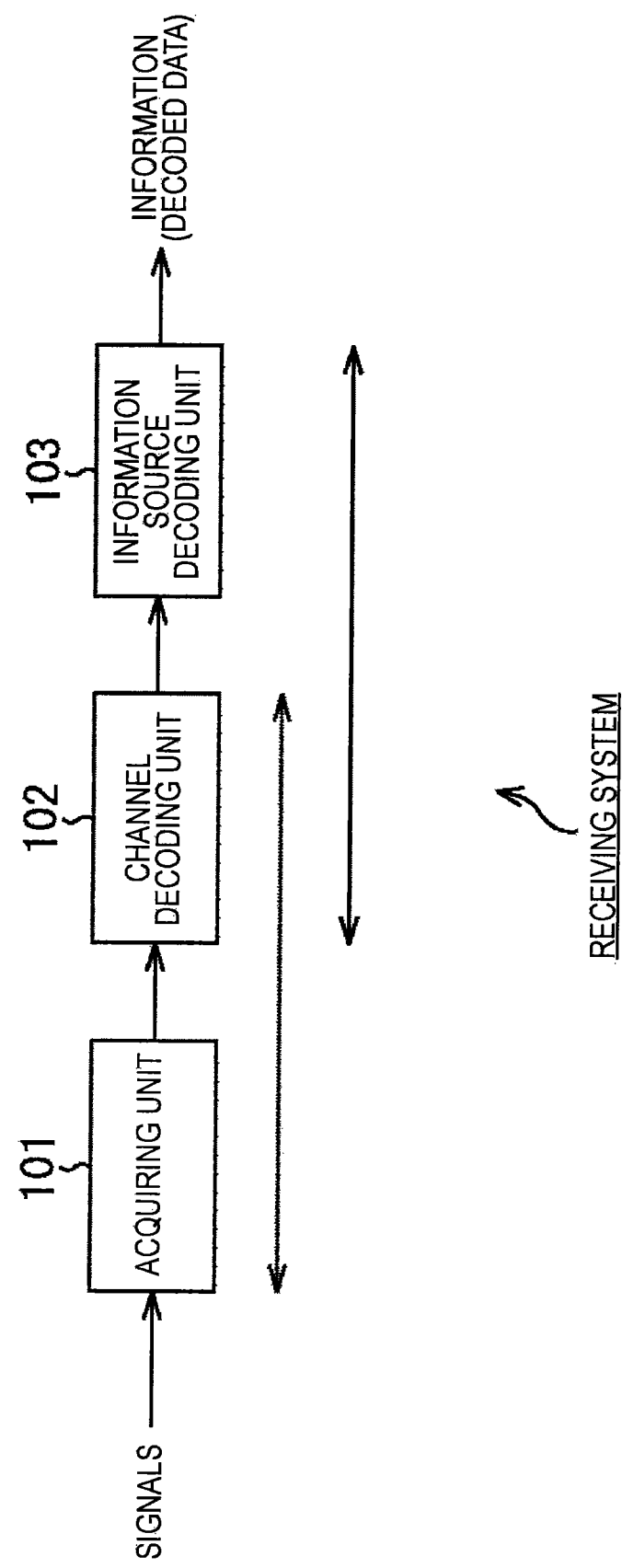
FIG. 11 is a block diagram showing an example structure of a first embodiment of a receiving system.

FIG. 11 is a block diagram showing an example structure of a first embodiment of a receiving system in which the signal processing unit 11 is used.

The receiving system shown in FIG. 11 includes an acquiring unit 101, a channel decoding unit 102, and an information source decoding unit 103.

The acquiring unit 101 acquires signals via a transmission channel (not shown) of a network such as digital terrestrial broadcasting, digital satellite broadcasting, a CATV network, or the Internet, and supplies the signals to the channel decoding unit 102. The signal processing unit 11 shown in FIG. 6 is included in the acquiring unit 101, for example.

The channel decoding unit 102 performs a channel decoding operation including error correction on the signals acquired by the acquiring unit 101 via a transmission channel, and supplies the resultant signals to the information source decoding unit 103.

The information source decoding unit 103 performs an information source decoding operation on the signals subjected to the channel decoding operation. The information source decoding operation includes an operation to expand compressed information to the original information and acquire data to be transmitted.

Specifically, the signals acquired by the acquiring unit 101 via a transmission channel might have been subjected to compression encoding for compressing information to reduce the amount of data such as images and sound. In such a case, the information source decoding unit 103 performs an information source decoding operation, such as an operation to expand the compressed information to the original information, on the signals subjected to the channel decoding operation.

In a case where the signals acquired by the acquiring unit 101 via a transmission channel have not been subjected to compression encoding, the information source decoding unit 103 does not perform an operation to expand the compressed information to the original information. Here, the expanding operation may be MPEG decoding, for example. The information source decoding operation may also include descrambling, as well as the expanding operation.

The receiving system shown in FIG. 11 can be used in a television tuner that receives digital television broadcasts, for example. Each of the acquiring unit 101, the channel decoding unit 102, and the information source decoding unit 103 can be formed as one independent device (hardware (such as an IC (Integrated Circuit)) or a software module).

Alternatively, the three units of the acquiring unit 101, the channel decoding unit 102, and the information source decoding unit 103 can be formed as one independent device. The acquiring unit 101 and the channel decoding unit 102 can also be formed as one independent device, and the channel decoding unit 102 and the information source decoding unit 103 can also be formed as one independent device.

Figure 12:
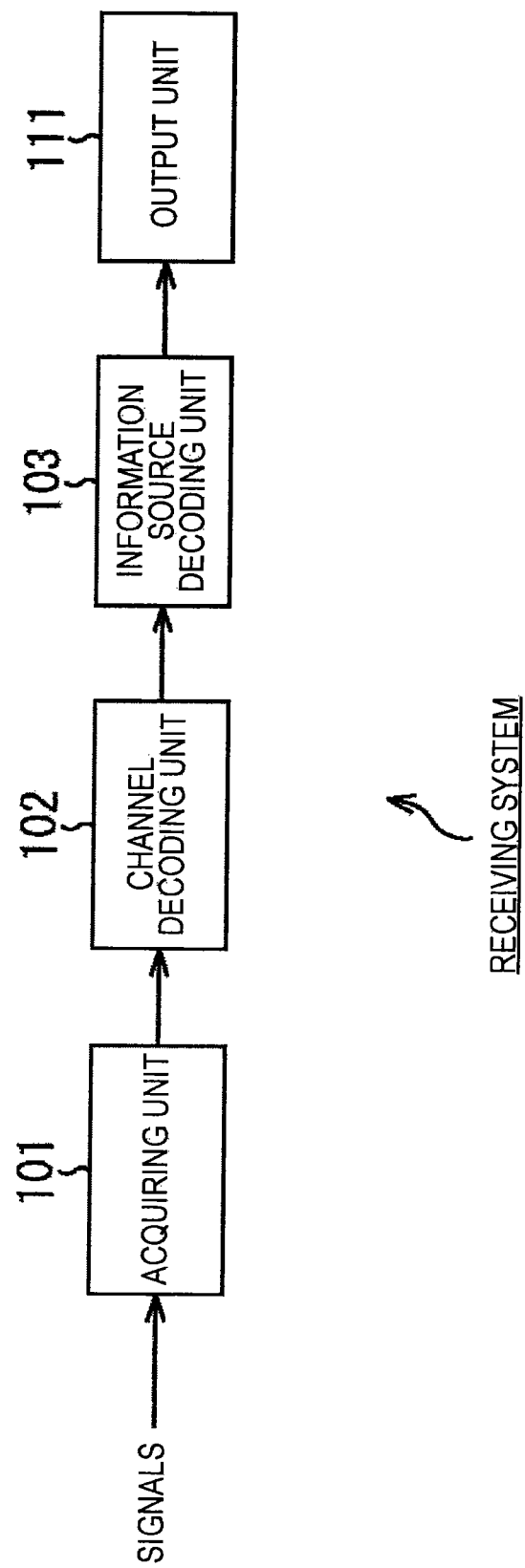
FIG. 12 is a block diagram showing an example structure of a second embodiment of a receiving system.

FIG. 12 is a block diagram showing an example structure of a second embodiment of a receiving system in which the signal processing unit 11 is used.

In the structure shown in FIG. 12, the components equivalent to the components shown in FIG. 11 are denoted by the same reference numerals as those in FIG. 11, and explanation of them will not be repeated.

The structure of the receiving system shown in FIG. 12 is the same as the structure shown in FIG. 11 in including the acquiring unit 101, the channel decoding unit 102, and the information source decoding unit 103, and differs from the structure shown in FIG. 11 in further including an output unit 111.

The output unit 111 is a display device that displays images or a speaker that outputs sound, for example. The output unit 111 outputs images or sound as signals that are output from the information source decoding unit 103. That is, the output unit 111 displays images, or outputs sound.

The receiving system shown in FIG. 12 can be used in a television receiver that receives television broadcasts as digital broadcasts, or in a radio receiver that receives radio broadcasts, for example.

In a case where signals acquired by the acquiring unit 101 have not been subjected to compression encoding, the signals that are output from the channel decoding unit 102 are supplied directly to the output unit 111.

Figure 13:
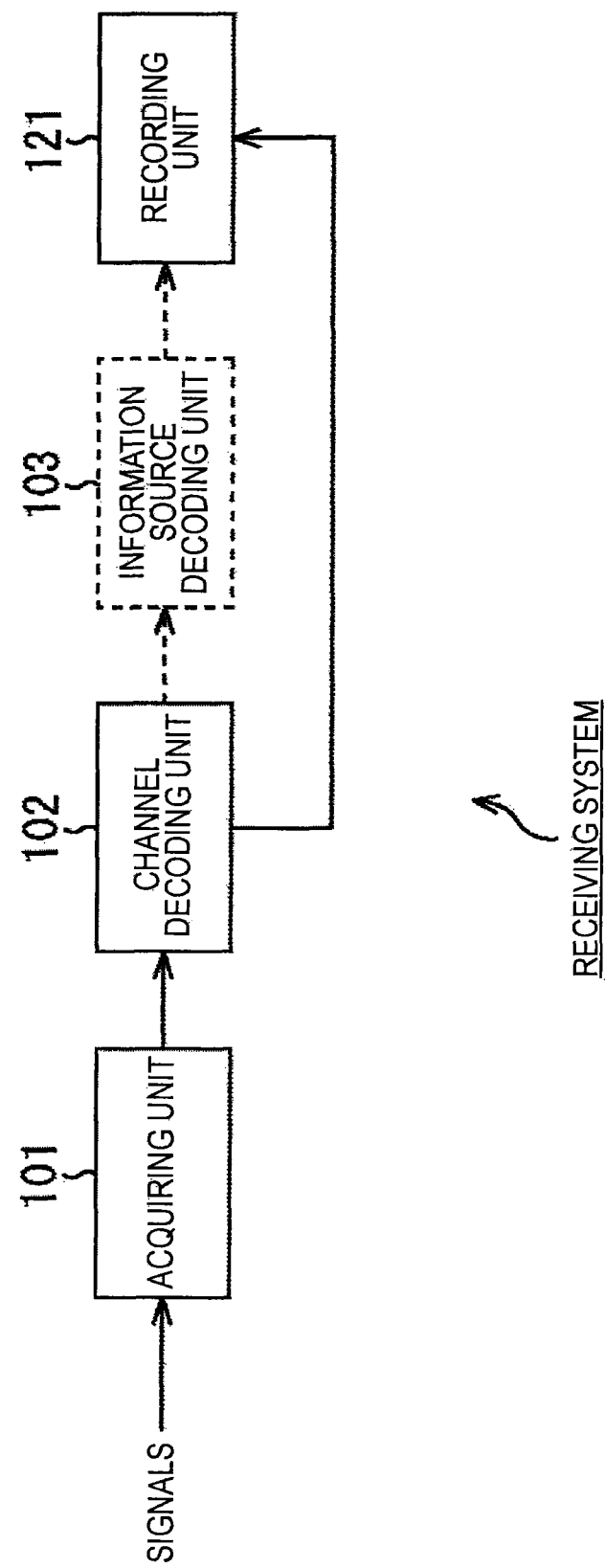
FIG. 13 is a block diagram showing an example structure of a third embodiment of a receiving system.

FIG. 13 is a block diagram showing an example structure of a third embodiment of a receiving system in which the signal processing unit 11 is used.

In the structure shown in FIG. 13, the components equivalent to the components shown in FIG. 11 are denoted by the same reference numerals as those in FIG. 11, and explanation of them will not be repeated.

The structure of the receiving system shown in FIG. 13 is the same as the structure shown in FIG. 11 in including the acquiring unit 101 and the channel decoding unit 102, and differs from the structure shown in FIG. 11 in not including the information source decoding unit 103 but further including a recording unit 121.

The recording unit 121 records (stores) signals (such as TS packets of MPEG TS) that are output from the channel decoding unit 102, on a recording (storage) medium such as an optical disk, a hard disk (a magnetic disk), or a flash memory.

The above described receiving system shown in FIG. 13 can be used in a recorder apparatus or the like that records television broadcasts.

The information source decoding unit 103 may be added, and signals subjected to the information source decoding operation at the information source decoding unit 103, or images or sound obtained by decoding, may be recorded by the recording unit 121.

[Example Structure of a Computer]

The above described series of operations can be performed by hardware, and can also be performed by software. In a case where the series of operations are performed by software, the program of the software is installed from a program recording medium into a computer incorporated into special-purpose hardware or a general-purpose personal computer, for example.

Figure 14:
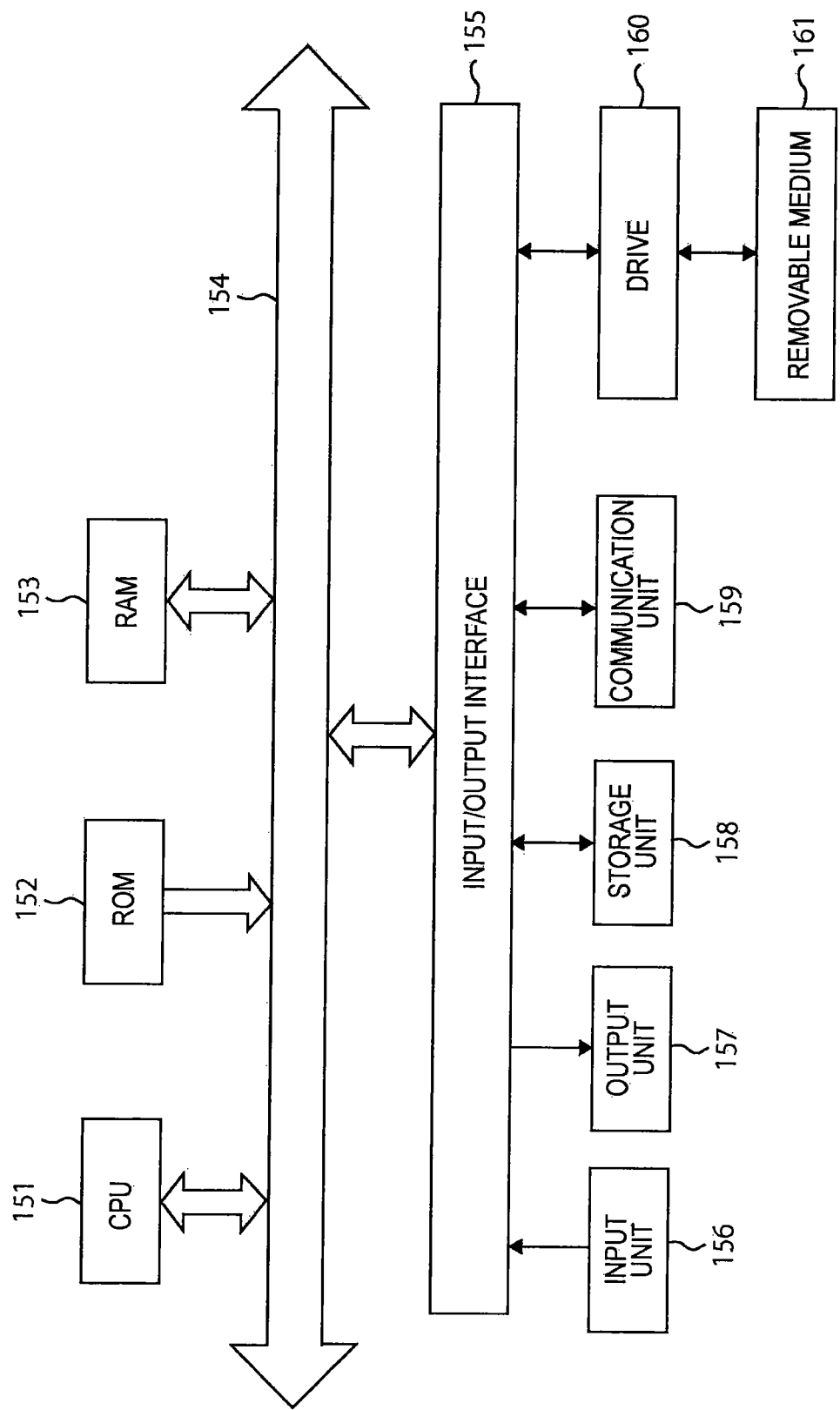
FIG. 14 is a block diagram showing an example structure of computer hardware.

FIG. 14 is a block diagram showing an example structure of the hardware of a computer that performs the above described series of operations in accordance with a program.

A CPU (Central Processing Unit) 151, a ROM (Read Only Memory) 152, a RAM (Random Access Memory) 153 are connected to one another by a bus 154.

An input/output interface 155 is further connected to the bus 154. An input unit 156 formed with a keyboard, a mouse, and the like, and an output unit 157 formed with a display, a speaker, and the like are connected to the input/output interface 155. A storage unit 158 formed with a hard disk, a nonvolatile memory, or the like, a communication unit 159 formed with a network interface or the like, and a drive 160 driving a removable medium 161 are also connected to the input/output interface 155.

In the computer having the above described structure, the CPU 151 loads a program stored in the storage unit 158 into the RAM 153 via the input/output interface 155 and the bus 154, for example, and executes the program, so that the above described series of operations are performed.

The program to be executed by the CPU 151 is recorded in the removable medium 161, for example, or is provided via wired or wireless transmission medium such as a local area network, the Internet, or digital broadcasting, and is installed into the storage unit 158.

The programs to be executed by the computer may be programs for performing operations in chronological order in accordance with the sequence described in this specification, or may be programs for performing operations in parallel or performing an operation when necessary, such as when there is a call.

It should be noted that embodiments of the present technique are not limited to the above described embodiments, and various modifications may be made to them without departing from the scope of the present technique.

[Other Modifications] The present technique may also be provided in the following forms.

(1)

A receiving device including:

a gain control unit that adjusts the power of a signal including a first pilot signal transmitted as signals having a high correlation in terms of polar direction via different transmission channels, and a second pilot signal transmitted as signals having a low correlation in terms of polar direction via the different transmission channels; and a control unit that controls the followability of the gain at the gain control unit in accordance with a data transmission method.

(2)

The receiving device of (1), wherein, when the data transmission method is MISO, the control unit causes the gain to follow with characteristics different from those with SISO.

(3)

The receiving device of (1) or (2), wherein the control unit controls the followability of the gain at the gain control unit by changing a parameter defining the followability of the gain.

(4)

The receiving device of (1) or (2), wherein the control unit controls the followability of the gain at the gain control unit by stopping the gain control while one of the first pilot signal and the second pilot signal is input.

(5)

The receiving device of any one of (1) to (4), wherein the gain control unit adjusts the power of an OFDM signal of DVB-T2, the first pilot signal is a Sum SP signal, and the second pilot signal is a Diff SP signal.

(6)

The receiving device of (5), further including a detecting unit that detects a P1 symbol, wherein, when the data transmission method indicated by information contained in the P1 symbol is MISO, the control unit controls the followability of the gain at the gain control unit.

(7)

The receiving device of (5) or (6), wherein the control unit controls the followability of the gain at the gain control unit by setting such a parameter as to make the followability of the gain lower than the followability that is achieved when the data transmission method is SISO.

(8)

The receiving device of (5) or (6), further comprising a processing unit that extracts the first pilot signal and the second pilot signal from the OFDM signal, and determines the pilot signal with the lower power, wherein the control unit controls the followability of the gain at the gain control unit by stopping the gain control while the pilot signal with the lower power is input.

(9)

The receiving device of (6), further comprising a processing unit that calculates a difference between the power of the first pilot signal and the power of the second pilot signal, wherein, when the data transmission method indicated by the information contained in the P1 symbol is MISO, and the difference between the power of the first pilot signal and the power of the second pilot signal is equal to or larger than a threshold, the control unit controls the followability of the gain at the gain control unit.

(10)

The receiving device of (9), wherein the control unit controls the followability of the gain at the gain control unit by setting such a parameter as to make the followability of the gain lower than the followability that is achieved when the data transmission method is SISO.

(11)

The receiving device of (9), wherein the processing unit further determines which one of the first pilot signal and the second pilot signal has the lower power, and the control unit controls the followability of the gain at the gain control unit by stopping the gain control while the pilot signal with the lower power is input.

(12)

A receiving method including the steps of:

adjusting the power of a signal including a first pilot signal transmitted as signals having a high correlation in terms of polar direction via different transmission channels, and a second pilot signal transmitted as signals having a low correlation in terms of polar direction via the different transmission channels by the gain control unit; and controlling the followability of the gain at the gain control unit in accordance with a data transmission method.

(13)

A program for causing a computer to perform an operation including the steps of:

adjusting the power of a signal including a first pilot signal transmitted as signals having a high correlation in terms of polar direction via different transmission channels, and a second pilot signal transmitted as signals having a low correlation in terms of polar direction via the different transmission channels by the gain control unit; and controlling the followability of the gain at the gain control unit in accordance with a data transmission method.

REFERENCE SIGNS LIST

11 Signal processing unit, 21 Digital AGC unit, 22 FFT operation unit, 23 Alamouti decoder, 24 P1 detection/Signaling interpreting unit, 25 Channel characteristics estimating unit, 26 Digital AGC control unit

The invention claimed is:

1. A receiving device comprising:
circuitry configured to operate in a Single Input Single Output (SISO) mode and a Multiple Input Single Output (MISO) mode, when in the MISO mode the circuitry is configured to:
receive an MISO signal including first pilot signals transmitted as signals having a high correlation in terms of polar direction via different spatial transmission channels, and second pilot signals transmitted as signals having a low correlation in terms of polar direction via the different spatial transmission channels;
adjust a power of the received MISO signal using a gain value;
extract the first pilot signals and the second pilot signals from the adjusted MISO signal;
determine, using at least one predetermined threshold value, which one of the extracted first pilots signals and the extracted second pilot signals has the lower power; and
control the gain value to follow characteristics of the received MISO signal except during instances corresponding to the determined lower power pilot signals in which case the control of the gain value is temporarily stopped.

2. The receiving device according to claim 1, wherein, when in the SISO mode, the circuitry is configured to cause a gain value to follow characteristics of a received SISO signal which operates differently than the control of the gain value by the circuitry when in the MISO mode.

3. The receiving device according to claim 1, wherein:
the MISO signal is an OFDM signal,
the first pilot signals are Sum Scattered Pilot (SP) signals, and
the second pilot signals are Diff SP signals.

4. The receiving device according to claim 3, wherein selection between the MISO mode and the SISO mode of the circuitry is based on information included in a P1 symbol within a preamble signal that is received before the MISO signal or an SISO signal.

5. The receiving device according to claim 4, wherein the ability of the gain value to follow the characteristics of the received MISO signal in the MISO mode is lower than an ability of a gain value to follow characteristics of a received SISO signal achieved in the SISO mode of the circuitry.

6. The receiving device according to claim 4, when in the MISO mode, the circuitry is further configured to calculate a difference between the power of the first pilot signals and the power of the second pilot signals using the at least one predetermined threshold value.

7. The receiving device according to claim 6, wherein the ability of the gain value to follow the characteristics of the received MISO signal in the MISO mode is lower than an ability of a gain value to follow characteristics of a received SISO signal achieved in the SISO mode of the circuitry.

8. A receiving method for a receiving device configured to operate in at least a Multiple Input Signal Output (MISO) mode, the receiving method corresponding to the MISO mode comprising the steps of:
receiving, with circuitry of the receiving device, an MISO signal including first pilot signals transmitted as signals having a high correlation in terms of polar direction via different spatial transmission channels, and second pilot signals transmitted as signals having a low correlation in terms of polar direction via the different spatial transmission channels;
adjusting, with the circuitry of the receiving device, a power of the received MISO signal using a gain value;
extracting, with the circuitry of the receiving device, the first pilot signals and the second pilot signals from the adjusted MISO signal;
determining, with the circuitry of the receiving device, which one of the extracted first pilot signals and the extracted second pilot signals has the lower power using at least one predetermined threshold value; and
controlling, with the circuitry of the receiving device, the gain value to follow characteristics of the received MISO signal except during instances corresponding to the determined lower power pilot signals in which case the control of the gain value is temporarily stopped.

9. An electronic device configured to operate in at least a Multiple Input Signal Output (MISO) mode, when in the MISO mode the electronic device comprises:
a communication interface configured to receive an MISO signal including first pilot signals transmitted as signals having a high correlation in terms of polar direction via different spatial transmission channels, and second pilot signals transmitted as signals having a low correlation in terms of polar direction via the different spatial transmission channels; and
circuitry configured to:
adjust a power of the received MISO signal using a gain value;
extract the first pilot signals and the second pilot signals from the adjusted MISO signal;
determine, using at least one predetermined threshold value, which one of the extracted first pilot signals and the extracted second pilot signals has the lower power; and
control the gain value to follow characteristics of the received MISO signal except during instances corresponding to the determined lower power pilot signals in which case the control of the gain value is temporarily stopped.

* * * * *